(12) United States Patent
Ueyama (10) Patent No.: US 11,506,684 B2
(45) Date of Patent: Nov. 22, 2022

(54) CONTACT PIN AND SOCKET (71) Applicant: Enplas Corporation, Kawaguchi (JP)

(72) Inventor: Yuki Ueyama, Saitama (JP)

(73) Assignee: Enplas Corporation, Kawaguchi (JP)

( * ) Notice: Subject to any disclaimer, the term of this patent is extended or adjusted under 35 U.S.C. 154(b) by 0 days.

(21) Appl. No.: 17/280,208

(22) PCT Filed: Sep. 20, 2019

(86) PCT No.: PCT/JP2019/036920
§ 371 (c)(1),
(2) Date: Mar. 26, 2021

(87) PCT Pub. No.: WO2020/066876
PCT Pub. Date: Apr. 2, 2020

(65) Prior Publication Data
US 2022/0034937 A1 Feb. 3, 2022

(30) Foreign Application Priority Data
Sep. 26, 2018 (JP) .............................. JP2018-180711

(51) Int. Cl.
*G01R 1/073* (2006.01)
*G01R 31/28* (2006.01)

(52) U.S. Cl.
CPC ..... *G01R 1/07314* (2013.01); *G01R 31/2886* (2013.01)

(58) Field of Classification Search
CPC .................................................. G01R 1/07314
See application file for complete search history.

(56) References Cited

U.S. PATENT DOCUMENTS 5,534,787 A * 7/1996 Levy ................. G01R 1/06772
324/755.05
6,396,293 B1 5/2002 Vinther et al.
(Continued)

FOREIGN PATENT DOCUMENTS

| JP | 2000-241447 | 9/2000 |
| JP | 2003-307525 | 10/2003 |

(Continued)

OTHER PUBLICATIONS

International Search Report and Written Opinion for International Application No. PCT/JP2019/036920 dated Dec. 10, 2019, 10 pages.

*Primary Examiner* — Paresh Patel
(74) *Attorney, Agent, or Firm* — Amin, Turocy & Watson, LLP (57) ABSTRACT

Provided is a contact pin comprising: a hollow first plunger that includes a first contact portion provided on one end side in a first direction and a first enlarged portion which is enlarged in a second direction intersecting the first direction; a second plunger, the one end of which is inserted into the first plunger and that includes a second contact portion provided on the other end side in the first direction and a second enlarged portion provided in a protruding portion protruding from the first plunger so as to be enlarged in the second direction; and a spring provided between the first and second plungers so as to surround the first and second plungers, wherein the first enlarged portion forms a curve shape to bulge outward.

4 Claims, 5 Drawing Sheets

(56) References Cited

U.S. PATENT DOCUMENTS

| | | | | |
|---|---|---|---|---|
| 6,462,567 B1 * | 10/2002 | Vinther | ............ | G01R 1/06722 324/755.05 |
| 2008/0042676 A1 | 2/2008 | Yamada et al. | | |
| 2010/0271061 A1 * | 10/2010 | Yamamoto | ......... | G01R 1/06722 324/754.03 |
| 2013/0257467 A1 | 10/2013 | Tomioka | | |
| 2017/0052217 A1 * | 2/2017 | Zhang | ................ | G01R 31/44 |

FOREIGN PATENT DOCUMENTS

| | | |
|---|---|---|
| JP | 2008-045986 | 2/2008 |
| JP | 2015-108608 | 6/2015 |
| WO | 2012/073701 | 6/2012 |

* cited by examiner

CONTACT PIN AND SOCKET

TECHNICAL FIELD

The present invention relates to a contact pin and a socket.

BACKGROUND ART

Sockets have been used for inspecting electrical components such as IC packages as described in, for example, Patent Literature (hereinafter, referred to as "PTL") 1. Such a socket is provided with a plurality of contact pins that electrically connect an electrical component and a board for inspection (hereinafter also referred to as "inspection board"), which is a board on the inspection device side.

Each contact pin includes a first movable member that comes into contact with a terminal of the electrical component, a second movable member that comes into contact with a terminal of the inspection board, and a coil spring, which is disposed between the first movable member and the second movable member and causes repulsion to separate the first movable member and the second movable member from each other.

Figure 5A:
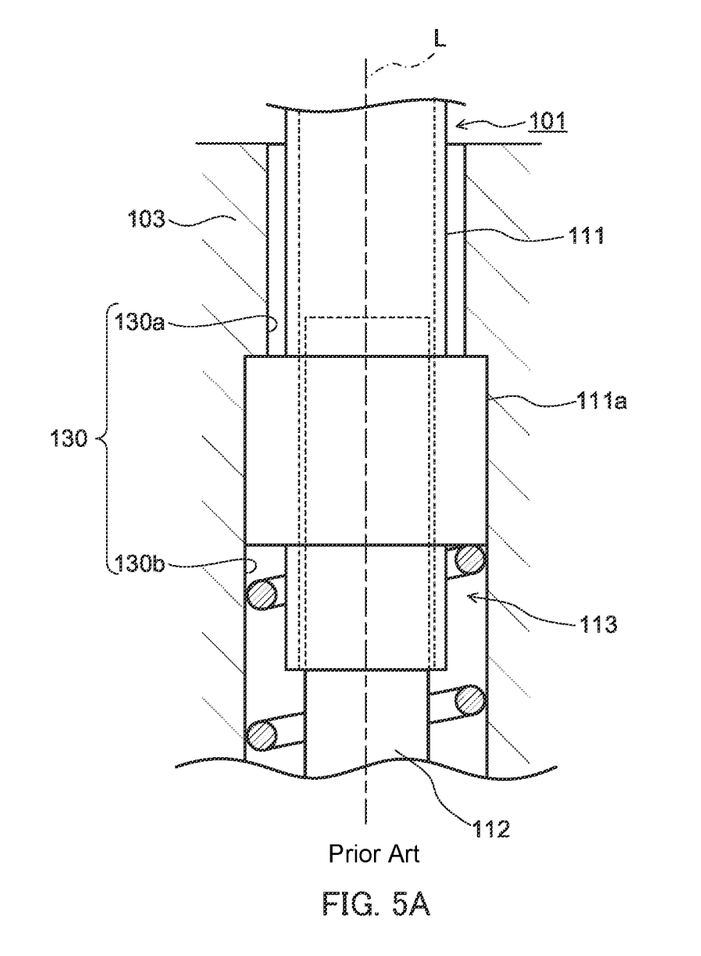
FIGS. 5A and 5B are schematic cross-sectional views illustrating the configuration of exemplary conventional contact pin and socket.
Figure 5B:
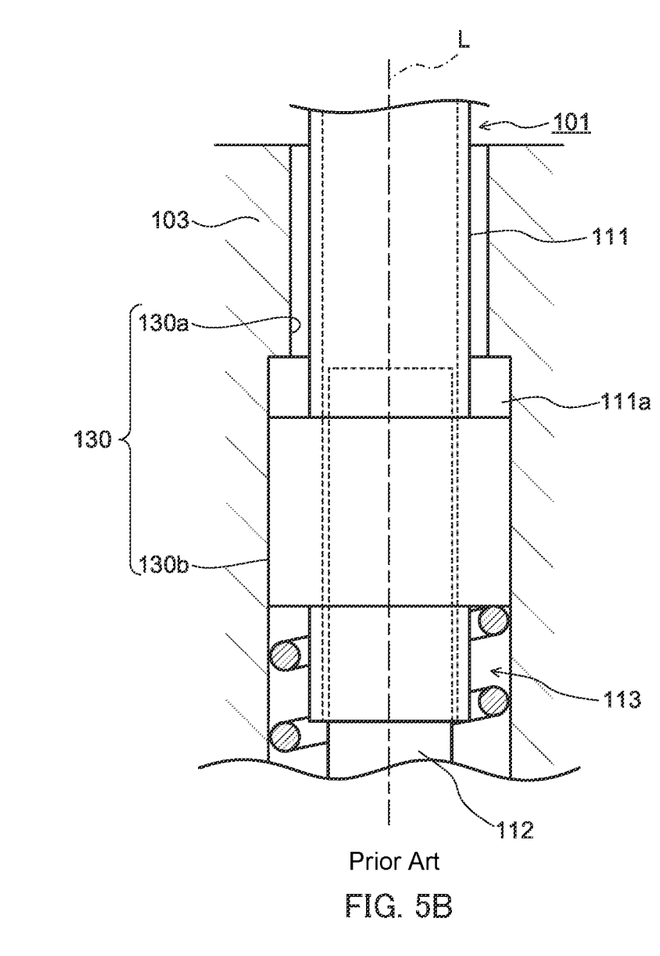

An exemplary configuration of a conventional socket will be described with reference to FIGS. 5A and 5B. FIGS. 5A and 5B are schematic cross-sectional views each illustrating the configuration of exemplary conventional contact pin and socket.

Contact pin 101 is inserted through a through hole 130 formed in housing 103 of the socket.

Contact pin 101 is provided with first plunger 111, second plunger 112, and coil spring 113.

First plunger 111 is a hollow member having a substantially cylindrical shape. Second plunger 112 is a member having a substantially columnar shape. Second plunger 112 is inserted into first plunger 111 from below, and is movable forward and backward relative to first plunger 111 along axial line L (or substantially along axial line L) of first plunger 111.

First plunger 111 includes cylindrical enlarged diameter portion 111a whose width along axial line L is increased. Second plunger 112 includes an enlarged diameter portion (not illustrated) at a position protruding from first plunger 111. Coil spring 113 is provided between enlarged diameter portion 111a of first plunger 111 and the enlarged diameter portion of second plunger 112.

The upper end of first plunger 111 comes into electrical contact with a solder ball of an IC package (not illustrated). The lower end of second plunger 112 comes into electrical contact with a terminal of an inspection board (not illustrated).

Housing 103 is provided with through hole 130 whose cross-sectional surface cut by a horizontal plane is circular. Through hole 130 is composed of small diameter portion 130a located on the upper side, a small diameter portion located on the lower side (not illustrated), and large diameter portion 130b formed between these small diameter portions.

Enlarged diameter portion 111a of first plunger 111 and the enlarged diameter portion of second plunger 112 are each formed to have a diameter larger than the inner diameters of upper small diameter portion 130a and lower small diameter portion of through hole 130. This configuration enables contact pin 101 to be held in through hole 130.

For an inspection by using such a socket, the socket is set on an inspection board (not illustrated) as a first step. From the state illustrated in FIG. 5A, the solder ball of the IC package is pressed against the upper end of first plunger 111.

As illustrated in FIG. 5B, second plunger 112 is thus relatively inserted into first plunger 111, and coil spring 113 is compressed by the pressure.

A force caused by the repulsive force of coil spring 113, namely a so-called preload, is applied between second plunger 112 and the terminal of the inspection board during the pressing. The preload contributes to stable contact between second plunger 112 and the terminal of the inspection board, and thus to reduction and stabilization of contact resistance therebetween.

CITATION LIST

Patent Literature

PTL 1
Japanese Patent Application Laid-Open No. 2015-108608

SUMMARY OF INVENTION

Technical Problem

Contact pin 101 and the socket illustrated in FIGS. 5A and 5B have the following disadvantages because enlarged diameter portion 111a of first plunger 111 extends straight along axial line L.

(1) Enlarged diameter portion 111a comes into surface contact with the inner wall surface of housing 103 that forms through hole 130. The frictional resistance during the movement of enlarged diameter portion 111a in through hole 130 increases, and thus contact pin 101 may not move smoothly in through hole 130.

(2) Enlarged diameter portion 111a limits the inclination of first plunger 111 in through hole 130. First plunger 111 and second plunger 112 are thus each in a posture with the axial line thereof oriented in the vertical direction, and the contact pressure between first plunger 111 and second plunger 112 is then more likely to become unstable resulting in unstable conductivity of contact pin 101.

The present invention has been made to solve such disadvantages. An object of the present invention is to improve the mobility and conductivity of a contact pin.

Solution to Problem

For solving the above described disadvantages in the conventional art, a contact pin of the present invention is provided with: a first plunger including a first contact portion provided on a first end side in a first direction, and a first enlarged portion which expands in a second direction intersecting the first direction, the first plunger being hollow; a second plunger including a second contact portion of which a first end in the first direction is inserted in the first plunger and which is provided on a second end side opposite to the first end side in the first direction, and a second enlarged portion which is provided in a protruding portion protruding from the first plunger and expands in the second direction; and a spring surrounding the first plunger and the second plunger and attached between the first enlarged portion and the second enlarged portion, in which the first enlarged portion is formed in a curved surface shape bulging outward.

For solving the above described disadvantages in the conventional art, a socket of the present invention is provided with the contact pin, and a support including a through hole into which the contact pin is inserted.

Advantageous Effects of Invention

The present invention is capable of improving the mobility and conductivity of a contact pin.

BRIEF DESCRIPTION OF DRAWINGS

FIGS. 1A and 1B illustrate the configuration of a contact pin, where

FIGS. 4A and 4B illustrate the configuration of a modification of the contact pin, where

DESCRIPTION OF EMBODIMENTS

Hereinafter, a contact pin and a socket according to at least one embodiment of the present invention will be described with reference to the drawings. The embodiment described below is merely an example, and does not exclude various modifications and the application of techniques which are not specified in the following embodiment. In addition, each configuration of the at least one embodiment can be variously modified and implemented without departing from the scope of the embodiment. Configurations of the at least one embodiment can also be selected or combined as needed.

In the following embodiment, a contact pin will be described under the assumption that a first plunger is disposed on the upper side and a second plunger is disposed on the lower side for convenience. How the contact pin and the socket are disposed is naturally not limited to such an assumption.

In all the drawings for describing the embodiment, an element the same as a precedent element is given, in principle, the same reference numeral, and the description thereof may be omitted.

Hereinafter, a contact pin and a socket according to an embodiment of the present invention will be described in detail with reference to the drawings.

[1. Configurations]

[1-1. Configuration of Contact Pin]

Figure 1A:
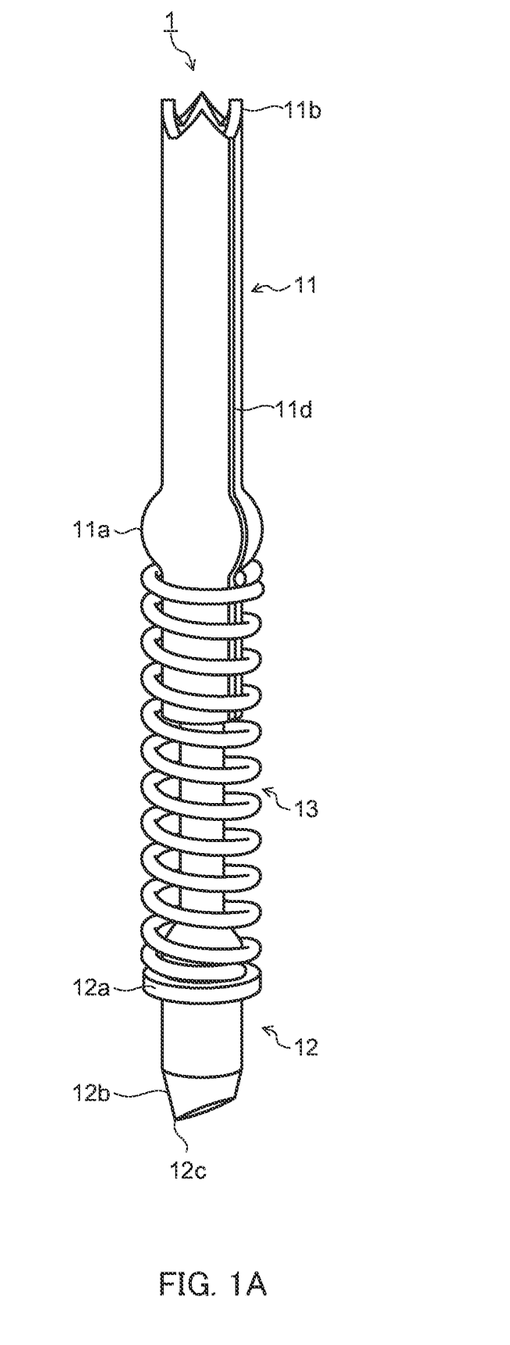
FIG. 1A is a perspective view of the contact pin and FIG. 1B illustrates a vertical cross sectional view of the contact pin.
Figure 1B:
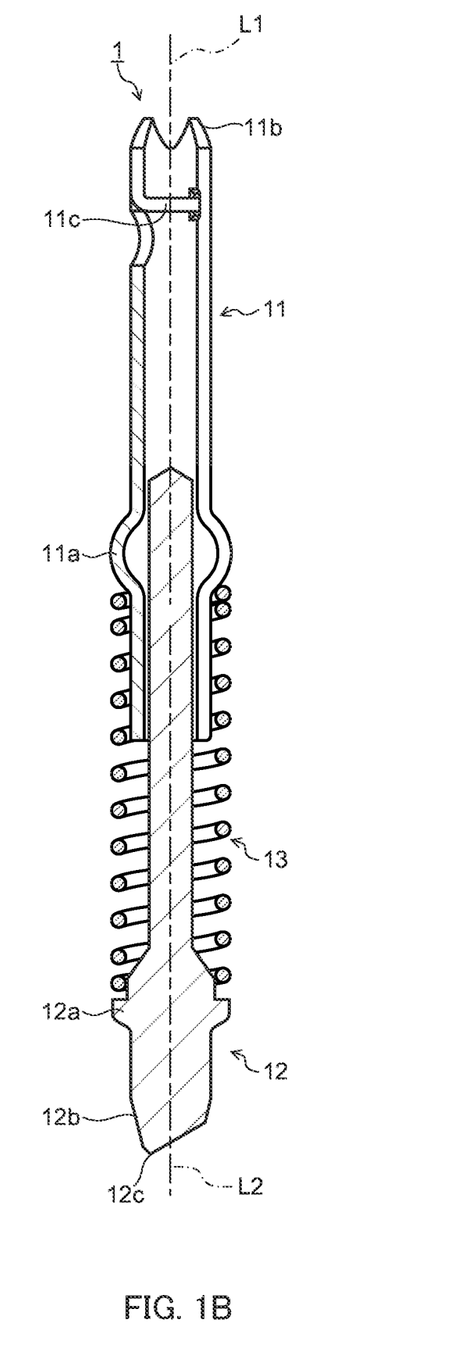

The configuration of a contact pin of an embodiment in the present invention will be described with reference to FIGS. 1A and 1B. FIGS. 1A and 1B illustrate a configuration of the contact pin, where FIG. 1A is a perspective view of the contact pin and FIG. 1B is a vertical cross-sectional view of the contact pin.

Contact pin 1 is provided with first plunger 11, second plunger 12 and coil spring 13.

First plunger 11 is a hollow member having a substantially cylindrical shape. Second plunger 12 is a member having a substantially columnar shape. Second plunger 12 is inserted through first plunger 11 from below, and is movable forward and backward from below first plunger 11 along axial line L1 (or substantially along axial line L1) of first plunger 11. First plunger 11 and second plunger 12 are each formed of a conductive material.

First plunger 11 is provided with bulging portion 11a, which expands in the horizontal direction (direction intersecting the vertical direction that is a first direction), in the middle portion of first plunger 11 in the axial direction. This bulging portion 11a constitutes a first enlarged portion of the present invention. Bulging portion 11a is formed in a curved surface shape that bulges outward (in the direction away from axial line L1). In the present embodiment, bulging portion 11a has a shape such that the upper portion and the lower portion of a hollow sphere are horizontally cut off.

At the upper end (namely, one end in the first direction) of first plunger 11, contact portion 11b (first contact portion) for contacting a solder ball of an IC package described below is provided. In the present embodiment, contact portion 11b is composed of a plurality of divided pieces having sharp tips, and contact portion 11b comes into contact with the solder ball so as to pierce the solder ball.

In addition, first plunger 11 is provided with lid 11c in the upper portion thereof, specifically at a position between bulging portion 11a and contact portion 11b and slightly below contact portion 11b. Lid 11c prevents cutting tips, which are scraped from the solder ball by contact portion 11b coming into contact with the solder ball so as to pierce the solder ball, from entering a part below the lid. This configuration prevents the cutting chips from entering the gap between first plunger 11 and second plunger 12 to hinder the relative movement of first plunger 11 and second plunger 12. Lid 11c is formed by making a substantially circular notch in a part of the cylindrical surface of first plunger 11 and folding the piece surrounded by the notch inward (toward axial line L side).

First plunger 11 is produced by rolling a plate material into a cylindrical shape in such a way that one end of the plate extending in the vertical direction abuts the other end of the plate extending the same direction. Reference numeral 11d in FIG. 1A represents an abutting portion between the one end and the other end. FIG. 1B is a cross-sectional view of contact pin 1 cut by a vertical plane passing through the abutting portion. Bulging portion 11a is formed by pressing the plate material, and both the outer wall surface and the inner wall surface of bulging portion 11a bulge outward.

As illustrated in FIGS. 1A and 1B, second plunger 12 includes in the lower portion thereof a flange-shaped enlarged diameter portion 12a. Coil spring 13 is attached between enlarged diameter portion 12a of second plunger 12 and bulging portion 11a of first plunger 11.

A second plunger 12 is provided, at the lower end thereof below enlarged diameter portion 12a, with tapered contact portion 12b (second contact portion) for contacting a terminal of an inspection board described below. Contact portion 12b has a shape such that a downwardly sharpened cone is cut diagonally. This configuration brings tip 12c of contact portion 12b, namely the contact point with the terminal of the inspection board, to a position separated from axial line L2 of second plunger 12.

[1-2. Configuration of Socket]

Figure 2:
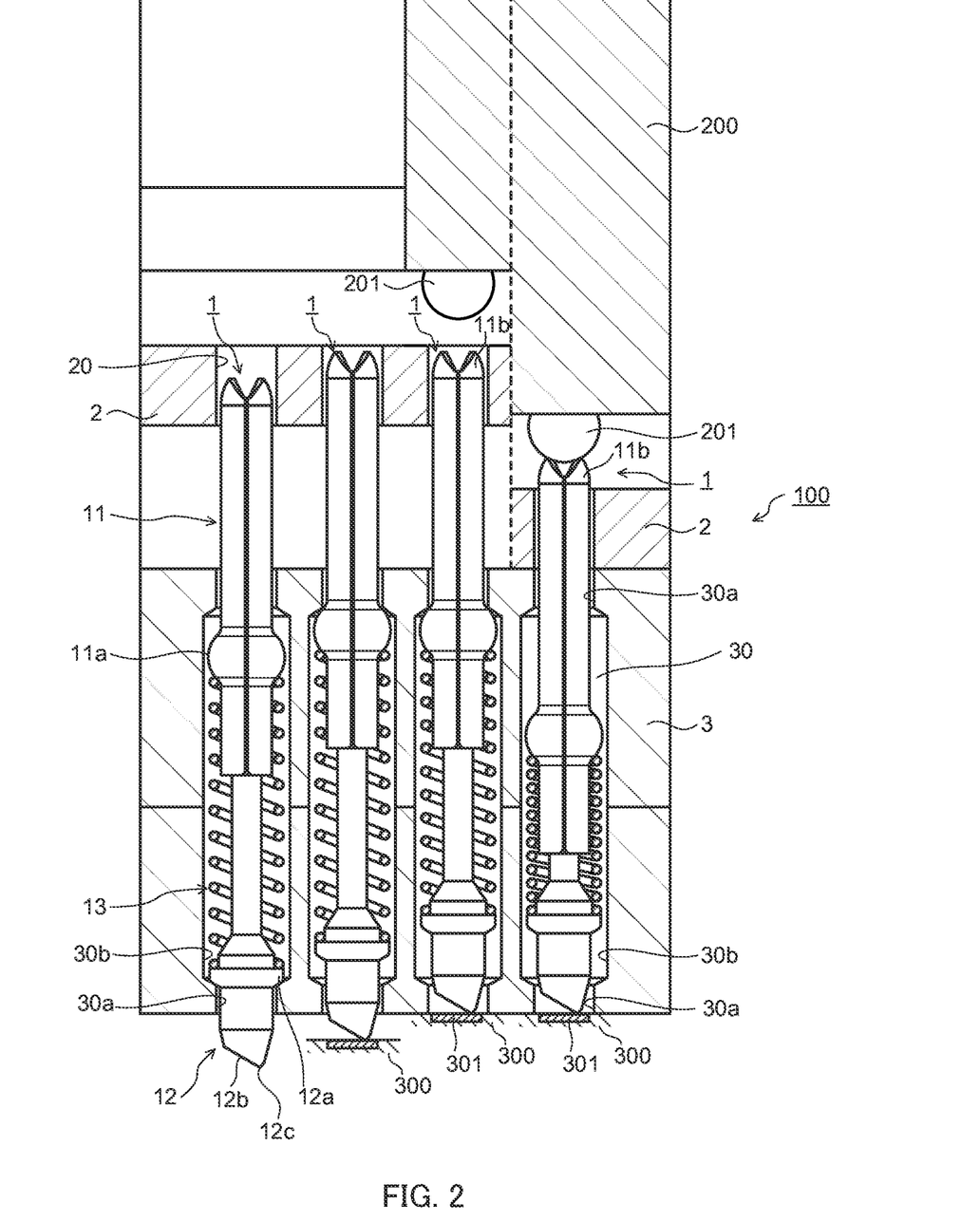
FIG. 2 is a cross-sectional view illustrating the configuration of a socket.

The configuration of a socket of an embodiment in the present invention will be described with reference to FIG. 2. FIG. 2 is a cross-sectional view illustrating the configuration of the socket. FIG. 2 illustrates different states of the socket side by side for convenience.

Socket 100 illustrated in FIG. 2 is provided with at least one contact pin 1, floating plate 2, and housing 3.

A plurality of solder balls 201, which are terminals, is disposed in a matrix on the bottom surface of IC package 200 to be connected to sockets 100. A plurality of contact pins 1 is disposed in a matrix so that its disposition coincides with the disposition of solder balls 201.

Floating plate 2 is provided above housing 3 so as to be detachable from housing 3.

A plurality of through holes 20 passing through floating plate 2 in the vertical direction is provided in floating plate 2. The disposition of each through hole 20 coincides with those of corresponding solder ball 201 and contact pin 1. The cross-sectional surface of each through hole 20 cut by a horizontal plane has a circular shape.

Similarly, housing 3 constituting a support of the present invention is provided with a plurality of through holes 30 passing through housing 3 in the vertical direction, and the disposition of each through hole 30 coincides with those of corresponding solder ball 201 and contact pin 1. The cross-sectional surface of each through hole 30 cut by a horizontal plane has a circular shape.

This configuration allows each contact pin 1 to be inserted through corresponding through hole 20 and through hole 30 arranged in the vertical direction in accordance with the disposition of corresponding solder ball 201.

Further, through hole 30 is composed of small diameter portion 30a located on the upper side, small diameter portion 30a located on the lower side, and large diameter portion 30b formed between these small diameter portions 30a, 30a. Small diameter portion 30a is formed to have an inner diameter smaller than the maximum outer diameters of bulging portion 11a of first plunger 11, enlarged diameter portion 12a of second plunger 12, and coil spring 13. In addition, large diameter portion 30b is formed to have a diameter slightly larger than the maximum outer diameters of bulging portion 11a of first plunger 11, enlarged diameter portion 12a of second plunger 12, and coil spring 13.

The maximum outer diameter of a part of first plunger 11 (the part located above bulging portion 11a and including contact portion 11b) is smaller than the inner diameters of upper side small diameter portion 30a and through hole 20 of floating plate 2. The maximum outer diameter of contact portion 12b located below enlarged diameter portion 12a of second plunger 12 is smaller than the inner diameter of lower side small diameter portion 30a. The part which is located above bulging portion 11a of first plunger 11 and includes contact portion 11b thus can protrude upward from upper side small diameter portion 30a and through hole 20 of floating plate 2. Similarly, contact portion 12b of second plunger 12 can protrude downward from lower side small diameter portion 30a.

This configuration enables coil spring 13 to be extended and compressed in through hole 30, and second plunger 12 to move forward and backward relative to first plunger 11, while contact pin 1 is prevented from coming off from through hole 30.

FIG. 2 illustrates different states of socket 100 for each contact pin 1, and each state will be described in order from the left in FIG. 2.

The first contact pin 1 from the left is in a natural state with no external force acts thereon, that is, in a state in which coil spring 13 is extended and thus contact pin 1 is extended. In this state, second plunger 12 is supported at its enlarged diameter portion 12a from below by the step between small diameter portion 30a located on the lower side and large diameter portion 30b in through hole 30, and contact portion 12b protrudes from the bottom surface of housing 3.

The whole of second contact pin 1 from the left is pushed up by inspection board 300. Specifically, contact pin 1 is pushed upward until the upper part of bulging portion 11a abuts the step between small diameter portion 30a located on the upper side and large diameter portion 30b in through hole 30.

The third contact pin 1 from the left (second from the right) is further pushed up by inspection board 300. Specifically, inspection board 300 is raised until its upper surface comes into contact with the bottom surface of housing 3. In this state, second plunger 12 is inserted deeper into first plunger 11 than before and coil spring 13 is compressed. In this state, IC package 200 is set above floating plate 2, but solder ball 201 is not in contact with contact portion 11b of contact pin 1.

The fourth contact pin 1 from the left (first from the right) is in the state at the time of inspection of IC package 200. That is, first plunger 11 is pushed downward by solder ball 201, and coil spring 13 is further compressed. Between second plunger 12 and terminal 301 of inspection board 300 in this state, a repulsive force generated from coil spring 13 acts as a preload between second plunger 12 and terminal 301 of inspection board 300.

[2. Action and Effect]

Figure 3A:
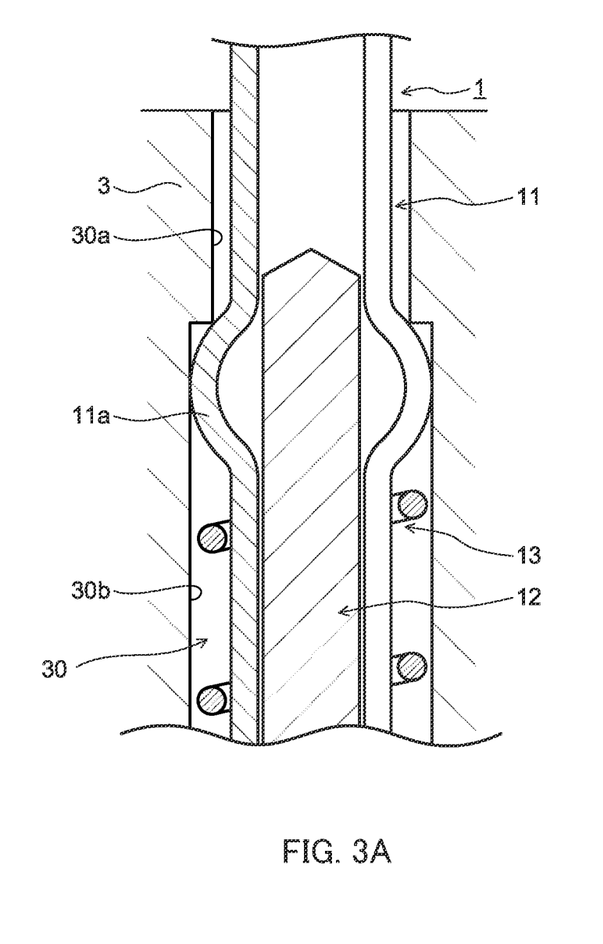
FIGS. 3A and 3B are schematic cross-sectional views for explaining the action and effect of the contact pin and the socket.
Figure 3B:
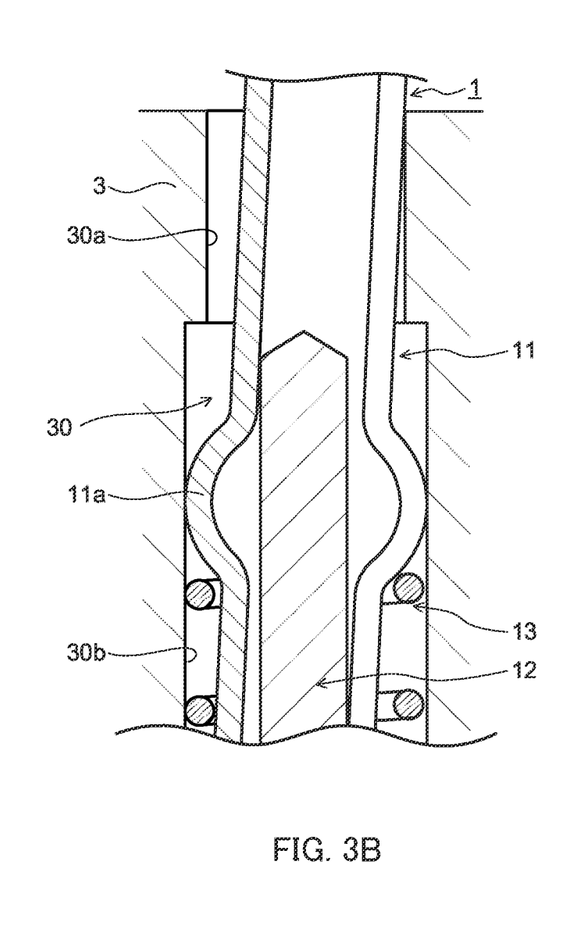

The action and effect of the socket and the contact pin of the embodiment in the present invention will be described with reference to FIGS. 1A to 3B. FIGS. 3A and 3B are schematic cross-sectional views for explaining the action and effect of the socket and the contact pin. FIG. 3A illustrates a state in which solder ball 201 does not push downward (see FIG. 2), that is, a state in which IC package 200 is not inspected. FIG. 3B illustrates a state in which solder ball 201 pushes downward, that is, a state in which IC package 200 is inspected.

A clearance is provided between coil spring 13 and the inner peripheral surface of large diameter portion 30b of through hole 30. Coil spring 13 thus descends in a meandering route while changing its position in the clearance from the state illustrated in FIG. 3A to the state illustrated in FIG. 3B as solder ball 201 pushes first plunger 11A and coil spring 13 downward.

Bulging portion 11a of first plunger 11 has a curved shape such that the diameter thereof gradually increases from the top of coil spring 13. This configuration improves the fit between coil spring 13 and bulging portion 11a. The curved shape of bulging portion 11a allows the contact area with the wall surface of housing 3 defining through hole 30 to become smaller than that of the straight-shaped enlarged diameter portion 111a illustrated in FIGS. 5A and 5B.

First plunger 11 is thus more likely to incline with respect to the vertical direction as first plunger 11 follows the meandering of coil spring 13, that is, first plunger 11 is more likely to incline with respect to second plunger 12. As a result, the weight of internal contact increases. That is, there is a part where second plunger 12 strongly hits the inner wall surface of first plunger 11. Therefore, the electric resistance value between first plunger 11 and second plunger 12 is stabilized, thereby stabilizing the conductivity of contact pin 1.

In addition, the followability of first plunger 11 to the meandering of coil spring 13 is improved, and also contact area between bulging portion 11a and the wall surface of housing 3 becomes smaller than that of the conventional art, which allows first plunger 11 to move in through hole 30 more smoothly.

Therefore, the mobility and conductivity of contact pin 1 can be improved.

As illustrated in FIG. 1B, tip 12c of contact portion 12b is at a position separated from axial line L2 in second plunger 12, second plunger 12 is more likely to incline with respect to the vertical direction when a load is applied with solder ball 201 of IC package 200 and terminal 301 of inspection board 300 pressing from both sides. During the load application, first plunger 11 and second plunger 12 are inclined in opposite directions in a balanced manner, allowing contact pin 1 to have a dogleg shape or an inverted dogleg shape. This configuration allows second plunger 12 to come into contact with the inner wall surface of first plunger 11 more strongly, further improving the mobility and conductivity of contact pin 1. FIG. 2 illustrate first plunger 11 and second plunger 12 in postures in which their axes L1 and L2 are along the vertical direction, for convenience.

[3. Modification]

Figure 4A:
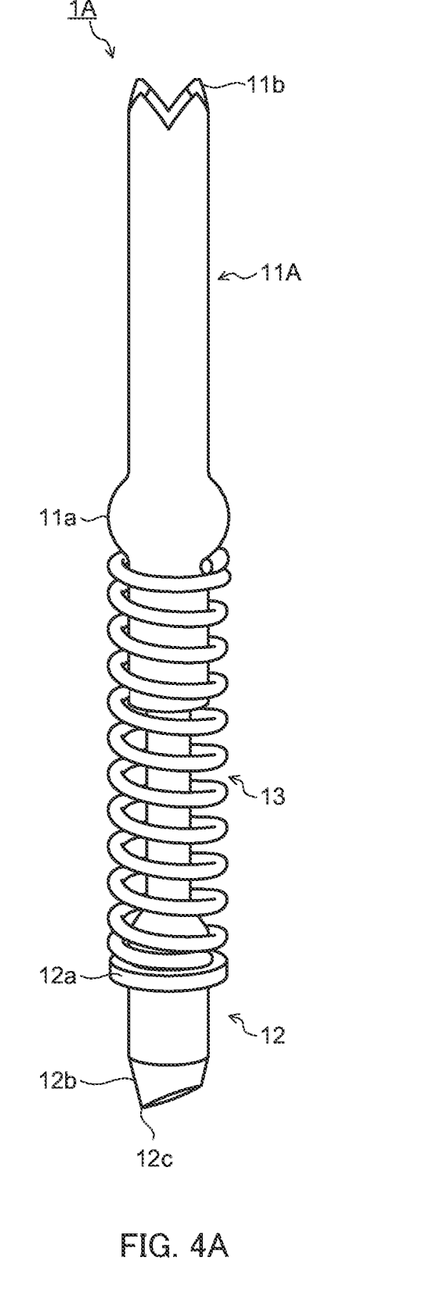
FIG. 4A is a perspective view of the contact pin and FIG. 4B illustrates a vertical cross section of the contact pin.
Figure 4B:
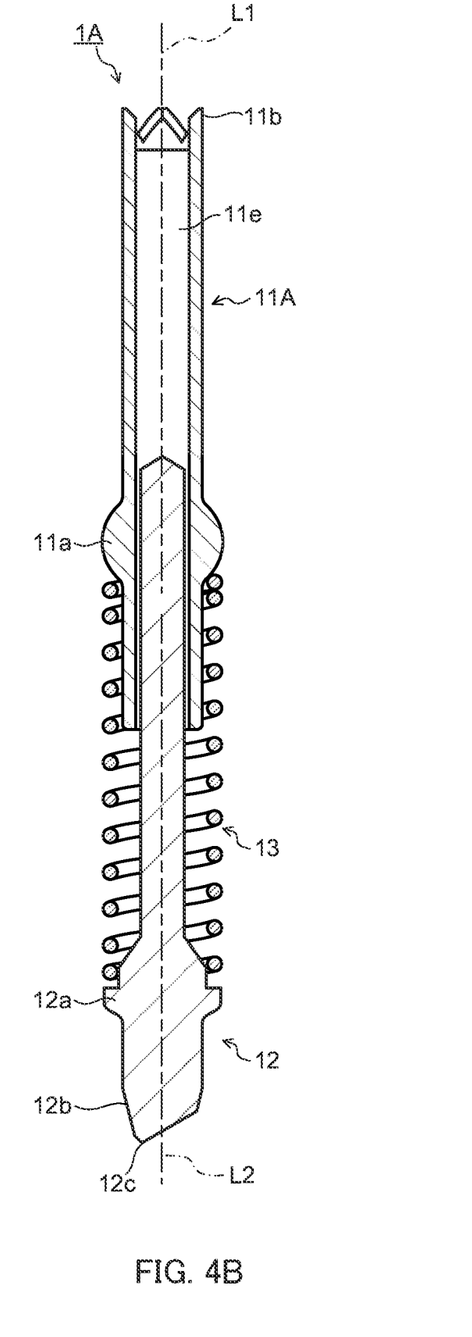

(1) The configuration of a modification of the contact pin will be described with reference to FIGS. 4A and 4B. FIGS. 4A and 4B illustrate the configuration of a modification of the contact pin, where FIG. 4A is a perspective view of the contact pin and FIG. 4B illustrates a vertical cross section of the contact pin.

First plunger 11A of contact pin 1A illustrated in FIGS. 4A and 4B is produced by machining. Specifically, hollow portion 11e of first plunger 11A is formed by cutting, thus has a straight shape with its inner diameter constant even at bulging portion 11a. Unlike contact pin 1 illustrated in FIGS. 1A and 1B, lid 11c is omitted in the modification. The other configurations are the same as those of contact pin 1, thus the description thereof will be omitted.

(2) In the previous embodiment, bulging portion 11a has a shape such that the upper portion and the lower portion of a sphere are horizontally cut off, but the shape of bulging portion 11a is not limited thereto. For example, bulging portion 11a may have a shape such that the upper portion and the lower portion of a vertically long ellipsoid or a horizontally long ellipsoid are cut off.

(3) The contact pin and the socket of the present invention is applied for inspection of an IC package in the previous embodiment, but the socket of the present invention is not limited to this application and may be applied for other various electrical components.

This application claims priority based on Japanese Patent Application No. 2018-180711, filed on Sep. 26, 2018, the entire contents of which including the specification and the drawings are incorporated herein by reference.

INDUSTRIAL APPLICABILITY

The present invention may be suitably used as a contact pin and a socket.

REFERENCE SIGNS LIST 1, 1A Contact pin
2 Floating plate
3 Housing (support)
11, 11A First plunger
11a Bulging portion (first enlarged portion)
11b Contact portion (first contact portion)
11c Lid
11d Abutting portion
11e Hollow portion
12 Second plunger
12a Enlarged diameter portion
12b Contact portion (second contact portion)
12c Tip
13 Coil spring (spring)
20 Through hole
30 Through hole
30a Small diameter portion
30b Large diameter portion
100 Socket
200 IC package
201 Solder ball
300 Inspection board
301 Terminal
L1 Axial line of first plunger
L2 Axial line of second plunger

The invention claimed is:

1. A contact pin, comprising:
a first plunger of a hollow type, including a first contact portion provided on a first end side in a first direction, and a first enlarged portion which expands in a second direction intersecting the first direction;
a second plunger including a second contact portion of which a first end in the first direction is inserted in the first plunger and which is provided on a second end side opposite to the first end side in the first direction, and a second enlarged portion which is provided in a protruding portion protruding from the first plunger and expands in the second direction; and
a spring surrounding the first plunger and the second plunger and attached between the first enlarged portion and the second enlarged portion, wherein
the first enlarged portion is formed in a curved surface shape bulging outward, and
the curved surface shape comprises a shape such that a diameter of the first enlarged portion gradually increases at least in a portion where the spring abuts.

2. The contact pin according to claim 1, wherein:
the second contact portion is formed in a tapered shape, and a tip of the second contact portion is separated from an axial line of the second plunger.

3. A socket, comprising:
the contact pin according to claim 1; and
a support including a through hole into which the contact pin is inserted.

4. The contact pin according to claim 1, wherein:
the curved surface shape comprises a shape such that upper and lower portions of a hollow sphere are cut off horizontally along the second direction or such that upper and lower portions of a hollow long ellipsoid are cut off, the ellipsoid being long vertically along the first direction or horizontally along the second direction.

* * * * *